(12) United States Patent
Takahashi

(10) Patent No.: US 7,259,638 B2
(45) Date of Patent: Aug. 21, 2007

(54) VOLTAGE CONTROLLED OSCILLATOR AND SEMICONDUCTOR INTEGRATED CIRCUIT FOR COMMUNICATION

(75) Inventor: Kouji Takahashi, Yokohama (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 77 days.

(21) Appl. No.: 11/220,597

(22) Filed: Sep. 8, 2005

(65) Prior Publication Data

US 2006/0055481 A1 Mar. 16, 2006

(30) Foreign Application Priority Data

Sep. 15, 2004 (JP) ............................ P2004-268700

(51) Int. Cl.
*H03B 1/00* (2006.01)
(52) U.S. Cl. .................... 331/179; 331/16; 331/177 V; 331/167; 331/117 R; 331/117 FE
(58) Field of Classification Search ................ 331/179, 331/177 V, 167, 117 R, 117 FE
See application file for complete search history.

(56) References Cited

U.S. PATENT DOCUMENTS 6,583,675 B2 * 6/2003 Gomez ........................ 331/17

7,119,624 B2 * 10/2006 Gomez ........................ 331/16
2001/0052823 A1 12/2001 Hirano et al.

FOREIGN PATENT DOCUMENTS

JP 2001-339301 12/2001

* cited by examiner

*Primary Examiner*—Arnold Kinkead
(74) *Attorney, Agent, or Firm*—Greenblum & Bernstein, P.L.C.

(57) ABSTRACT

A VCO include a resonance tank circuit(A) and an amplification circuit(B) which oscillates and is amplified at a resonance frequency of the resonance tank circuit(A). The resonance tank circuit(A) is provided with a capacity band switching circuit(D) for varying an oscillation frequency band, and a current band switching circuit(E) for feeding an appropriate current, corresponding to each oscillation frequency band, to the amplification circuit(B). This allows expansion of the oscillation frequency variable range as well as realization of a favorable phase noise characteristic in a broad band by optimization of a current in each frequency band.

3 Claims, 10 Drawing Sheets

VOLTAGE CONTROLLED OSCILLATOR AND SEMICONDUCTOR INTEGRATED CIRCUIT FOR COMMUNICATION

BACKGROUND OF THE INVENTION

1. Field of the Invention

The present invention relates to a voltage controlled oscillator capable of switching an oscillation frequency, and further to an effective technique for improvement in characteristic of a voltage controlled oscillator integrated into a chip. The present invention is directed to expanding a frequency variable range and providing a voltage controlled oscillator that has a stable and sufficiently small phase noise characteristic regardless of an oscillation frequency.

2. Description of the Related Art

With the recent increase in integration of a semiconductor integrated circuit for communication, a phase noise of a voltage controlled oscillator (VCO), having hitherto been constituted of an outboard module, is attempted to be lowered by improvement in a Q value of a spiral inductor produced on an on-chip, and by provision of a capacity band switching circuit as shown in a VCO of FIG. 9 to lower a change in frequency (hereinafter referred to as VCO sensitivity) with respect to a control voltage VT. Thereby, the integration of the voltage controlled oscillator into a chip has been realized (eg. Cf. Japanese Patent Laid-Open No. 2001-339301)

The VCO of FIG. 9 comprises: a resonance tank circuit A, comprising reactors L1 and L2, fixed capacities C1 and C2, a pair of variable capacity diodes VC1 and VC2 anodes of which are grounded, and negative resistors R1 and R2 connected respectively to the respective cathodes of the variable capacity diodes VC1 and VC2; an amplifier B comprising N-MOSFETs N1 and N2 for positive feedback (oscillation) amplification with an oscillation frequency of the resonance tank circuit A; and a current mirror circuit C comprising transistors Q1 and Q2 for feeding a constant current IVCO to N-MOSFETs N1 and N2.

By a change in control voltage VT to be applied to the respective cathodes of the variable capacity diodes VC1 and VC2 via the negative resistors R1 and R2, capacity values of the variable capacity diodes VC1 and VC2 change, and thereby the oscillation frequency changes in the resonance tank circuit A.

Further, the VCO of FIG. 9 comprises a capacity band switching circuit D. After capacity band switching capacities C3, C4, C5, C6, C7 and C8 are selectively added by the on/off of respective switches SW, an oscillation frequency can be changed in each of different frequency bands by control of the control voltage VT. The oscillation frequency fVCO of the VCO of FIG. 9 is given by equation 1. It is to be noted that the constitution of this capacity band switching circuit D is specifically described later.

$$fVCO = 1/2\pi\sqrt{L \cdot Ct} \tag{1}$$

where Ct is a total sum of capacity components on the actuating piece side of the voltage control oscillator, and when all the switches are on, Ct=parasitic capacity+C3+C5+C7+C1·VC1/(C1+VC1)

Here, in the case where the frequency characteristics of the oscillation transistors N1 and N2 are sufficiently high, the lower the oscillation frequency fVCO becomes, the larger the capacity value needs to be made, as seen from Expression 1. This therefore means that the voltage controlled oscillator is in operation in the state of having a large parasitic capacity. When a voltage controlled oscillator, designed with a certain frequency as an operational frequency, is used with a frequency lower than the oscillation frequency used in the designing, an output amplitude decreases to cause a phase noise to increase. Further, as opposed to this, when a voltage controlled oscillator, designed with a certain frequency as an operational frequency, is used with a frequency higher than the oscillation frequency used in the designing, a phase noise increases under the influence of an excess current noise and because the output amplitude increases to exceed the optimum operational range of the transistors N1 and N2.

On the other hand, in the case where the frequency characteristics of the oscillation transistors N1 and N2 are low, when a voltage controlled oscillator designed with a certain frequency as an operational frequency is used with a frequency lower than the oscillation frequency used in the designing, driving capacities of the oscillation transistors N1 and N2 become more dominant than in the state where the parasitic capacity is large, to cause an output amplitude to increase, leading to reduction in phase noise. As opposed to this, when a voltage controlled oscillator, designed with a certain frequency as an operational frequency, is used with a frequency higher than the oscillation frequency used in the designing, the frequency characteristics of the oscillation transistors N1 and N2 decrease, and due to insufficient driving capacities, an output amplitude is reduced, leading to an increase in phase noise.

FIG. 10 shows actual measurement values of the phase noise characteristics in the respective cases where the frequency characteristic of the oscillation transistor is sufficiently high and low in the conventional circuit of FIG. 9.

As described above and seen from FIG. 10, in both the cases where the frequency characteristics of the oscillation transistors N1 and N2 are sufficiently high (shown by a solid line) and low (shown by a broken line), in a voltage controlled oscillator designed with a certain frequency as an operational frequency, an increase in phase noise or stopping of oscillation in a narrow band may be incurred if a frequency other than the frequency used in the designing is oscillated. It has therefore been difficult to integrate a voltage controlled oscillator into a chip in a communication system requiring a strict phase noise characteristic, such as GSM (Global System for Mobile Communication), and to realize one on-chip voltage controlled oscillator in a frequency band using two systems such as GSM and DCS (Digital Cellular System).

For solving this problem, there is a method of making an inductor externally placed to increase a Q value, as well as a method of using a mask option to increase a Q value of a spiral inductor or a Q value of a capacity, so as to reduce a phase noise. However, this method has a problem of causing an increase in production cost.

The present invention is solving the above-mentioned conventional problems, to expand a used frequency band and provide an on-chip voltage controlled oscillator into which a favorable phase noise characteristic in a broad band is integrated at low cost.

SUMMARY OF THE INVENTION

In the present invention, a voltage controlled oscillator comprises: a resonance tank circuit comprising an inductor and a variable capacity diode; and an amplification circuit which oscillates and is amplified at a resonance frequency of the resonance tank circuit, and changes a control voltage to the variable capacity diode for changing the oscillation frequency, wherein the resonance tank circuit is provided with: a capacity band switching circuit for selectively adding a capacity to change an oscillation frequency band; and a current band switching circuit for feeding an appropriate driving current to the amplification circuit, with respect to the oscillation frequency band selected by the capacity band switching circuit.

According to the present invention, it is possible to expand a frequency variable range and integrate a voltage controlled oscillator, having a favorable phase noise characteristic in a wide frequency band, into a chip. It is therefore possible, depending upon communication systems, to allow one voltage controlled oscillator to control a plurality of communication systems, so as to integrate at low cost a frequency synthesizer employing the voltage controlled oscillator of the present invention.

DESCRIPTION OF THE PREFERRED EMBODIMENTS

Figure 1:
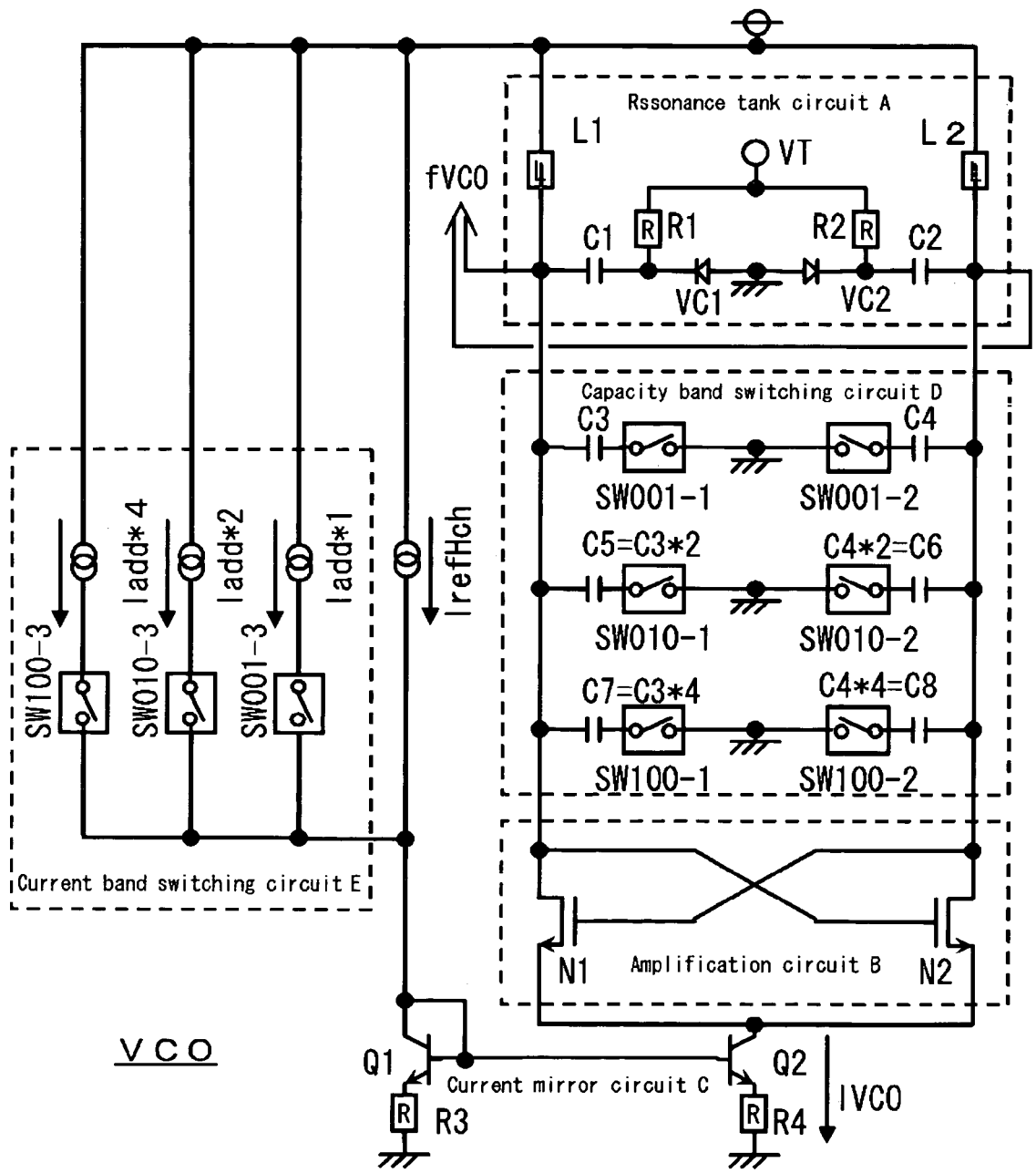
FIG. 1 is a block diagram of a voltage controlled oscillator in an embodiment of the present invention.
Figure 9:
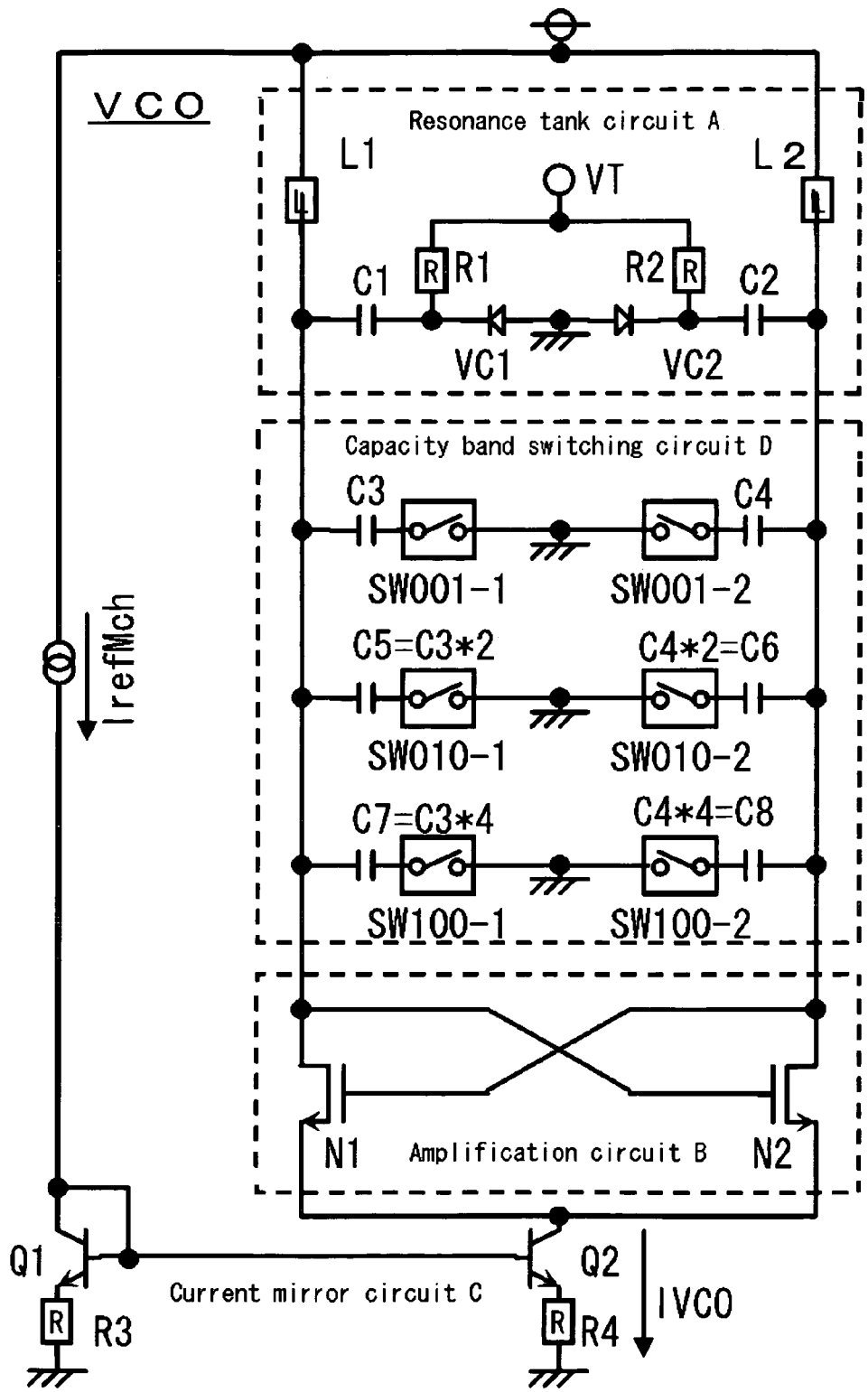
FIG. 9 is a block diagram of a conventional voltage controlled oscillator.
Figure 10:
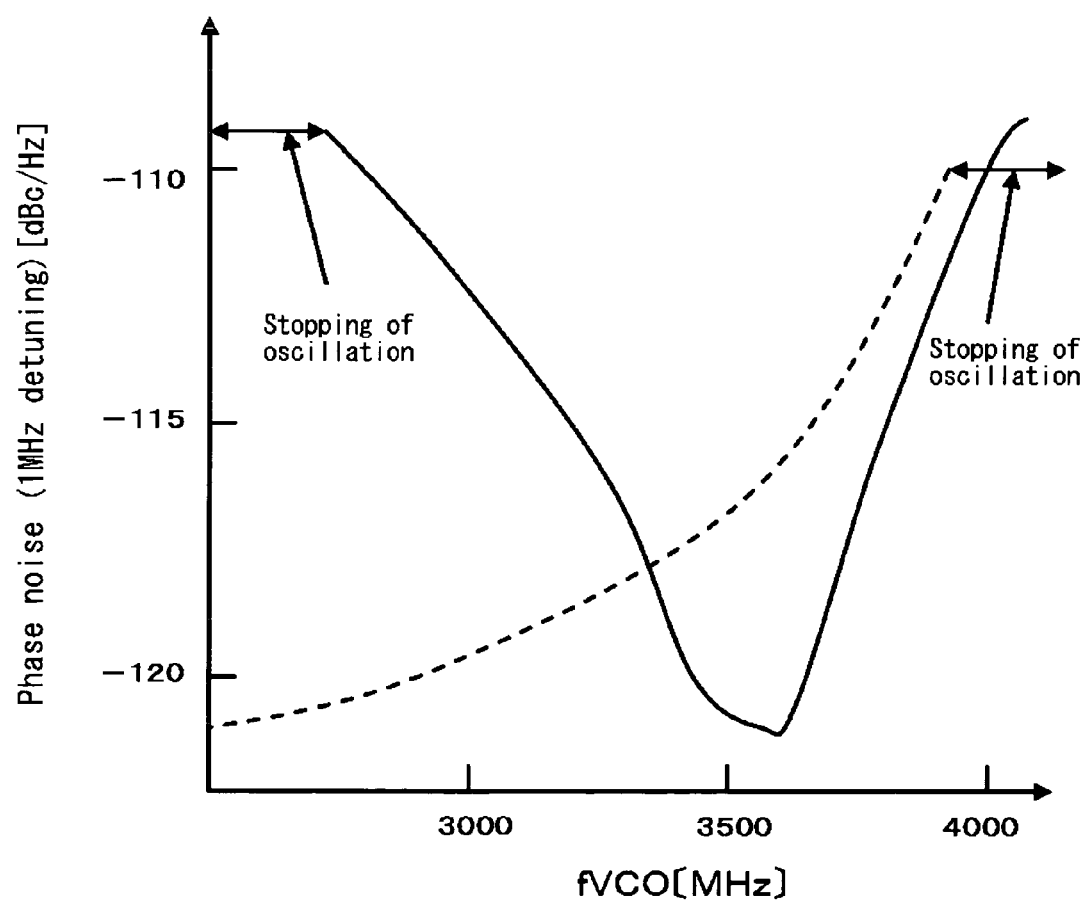
FIG. 10 is a characteristic graph of the oscillation frequency versus the phase noise in the conventional voltage controlled oscillator.

FIG. 1 shows a basic constitution of a voltage controlled oscillator (VCO) of the present invention. As seen from comparison with the conventional circuit of FIG. 9, in the VCO of FIG. 1, current sources Iadd*1, Iadd*2 and Iadd*4 are provided in parallel with a current source I refHch of one transistor Q1 of a current mirror circuit C. For supplying and breaking supply currents from the current sources, switches SW001-3, SW010-3 and SW100-3 are inserted in series with the current sources. It should be noted that any kind of circuit other than a switch circuit may be used so long as the switch function is satisfied.

The supply current of the current source Iadd*2 is twice as large as the supply current of the current source Iadd*1, and the supply current of the current source Iadd*4 is four times as large as the supply current of the current source Iadd*1. The current value of the current source Iadd*1 itself is arbitral settable.

Meanwhile in the capacity band switching circuit D, the values of capacities C3, C5 and C7 on the left side are: C5=C3×2, C7=C3×4. Similarly, values of capacities C4, C6 and C8 on the right side are: C6=C4×2, C8=C4×4. It is to be noted that, in this specification, C3 and the like denote values (capacity values) as well as part names for simplifying descriptions.

When the capacity value of C3 is set to "1", with C3, C5 and C7 in combination with the respective on/off switches, there are in total eight kinds of charge capacity values: "0", "1", "2", "3", "4", "5", "6" and "7". As shown later in Tables 1 and 2, eight frequency bands, Characteristics 1 to 8, are realized with three capacities (when each capacity value is the same, eight capacities and eight switches are required.)

Further, pairs of symmetrically left and right capacities (C3-C4), (C5-C6) and (C7-C8) are selectively grounded via switches SW001 (SW001-1 and SW001-2), SW010 (SW010-1 and SW010-2) and SW100 (SW100-1 and SW100-2), respectively.

The number of switches in the current band switching circuit E is made the same as the number of switches in the capacity band switching circuit D.

The ratios of the number and capacity value of the capacities for switching the frequency bands in the resonance tank circuit A are not limited to those of FIG. 1. Further, although an Nch-MOS transistor was used as the oscillation transistor in the amplification circuit B, an NPN transistor may also be used.

Figure 2:
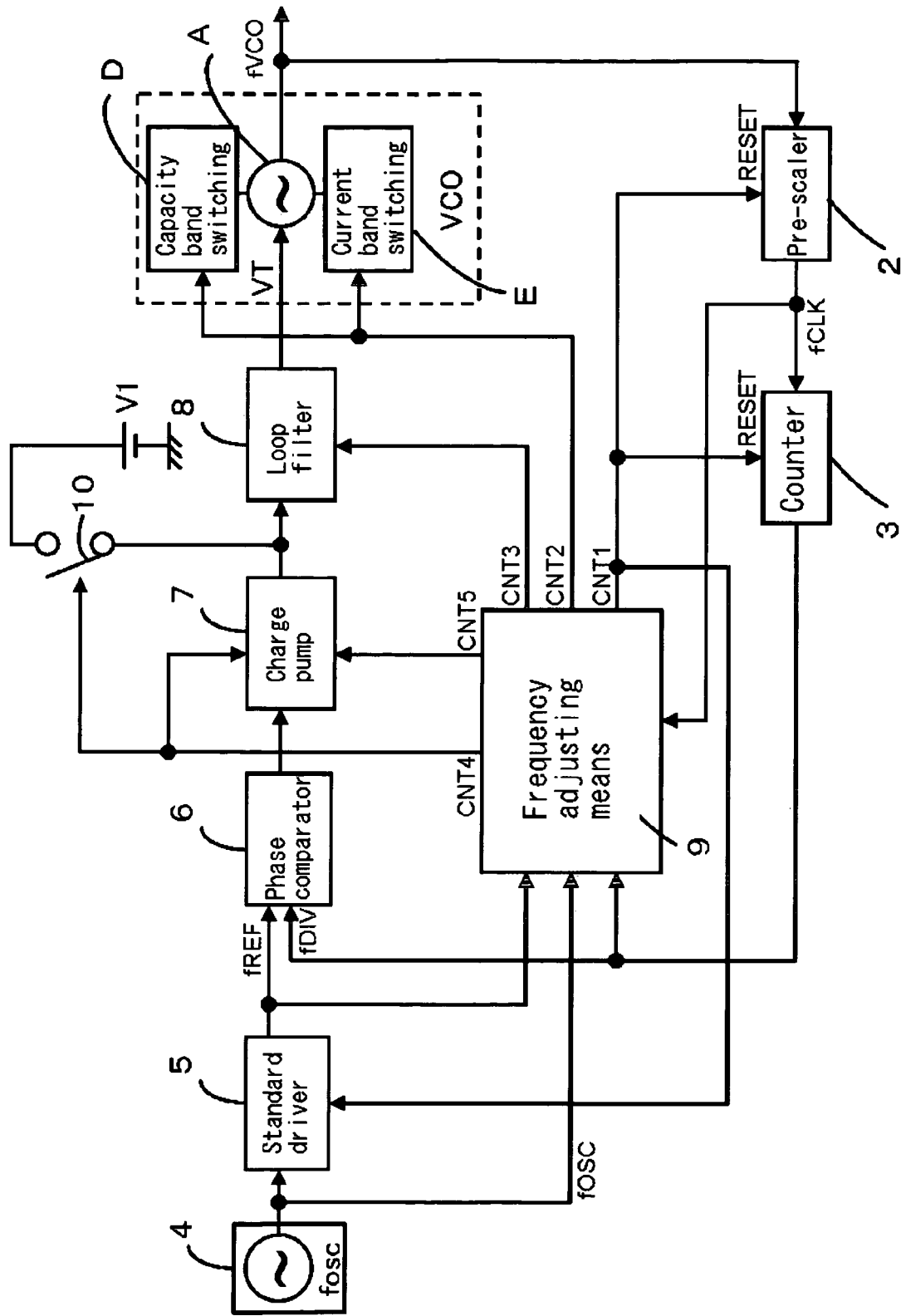
FIG. 2 is a block diagram of a frequency synthesizer in the embodiment of the present invention.

Next, a circuit constitution of a frequency synthesizer employing the VCO of FIG. 1 is shown in FIG. 2. Part of output signals of the frequency fVCO from VCO (hereinafter, such outputs are simply referred to as output signals fVCO) is supplied to a pre-scaler 2. This frequency is divided to a clock fCLK, which is counted with a counter 3. When counting a prescribed count value, the counter 3 outputs a signal FDIV.

Meanwhile, an output signal fosc of a standard signal source 4 is divided to a signal FREF with a standard divider 5. A phase comparator 6 compares the phase of the signal FREF with the phase of the signal fDIV. A charge pump 7 outputs a voltage signal proportional to the obtained phase difference. A loop filter 8 makes this voltage signal smooth to be supplied as a control voltage VT of the VCO.

Above described was the commonly used circuit constitution, and the circuit constitution of the present invention is as follow. In the circuit of the present invention, the output signal fosc of the standard signal source 4, the output signal FREF of the standard divider 5 and the output signal fDIV of the counter 3 are inputted. The circuit of the present invention comprises: a frequency adjusting means 9 for outputting a signal CNT 1 to each of reset terminals of the pre-scaler 2, the counter 3 and the standard divider 5, a signal CNT2 to the VCO, a signal CNT3 to the loop filter 8, and a signal CNT4 to the charge pump 7 and a switch 10, and a signal CNT 5 to the charge pump 7; and the switch 10 for applying a voltage V1 to the loop filter 8 in accordance with the signal CNT4. As specifically described later, the signal CNT 2 for controlling the VCO includes switch shifting signals (SG001, SG010, SG100, SG002, SGO20 and SG200) with respect to the capacity band switching circuit D and the current band switching circuit E.

Figure 3:
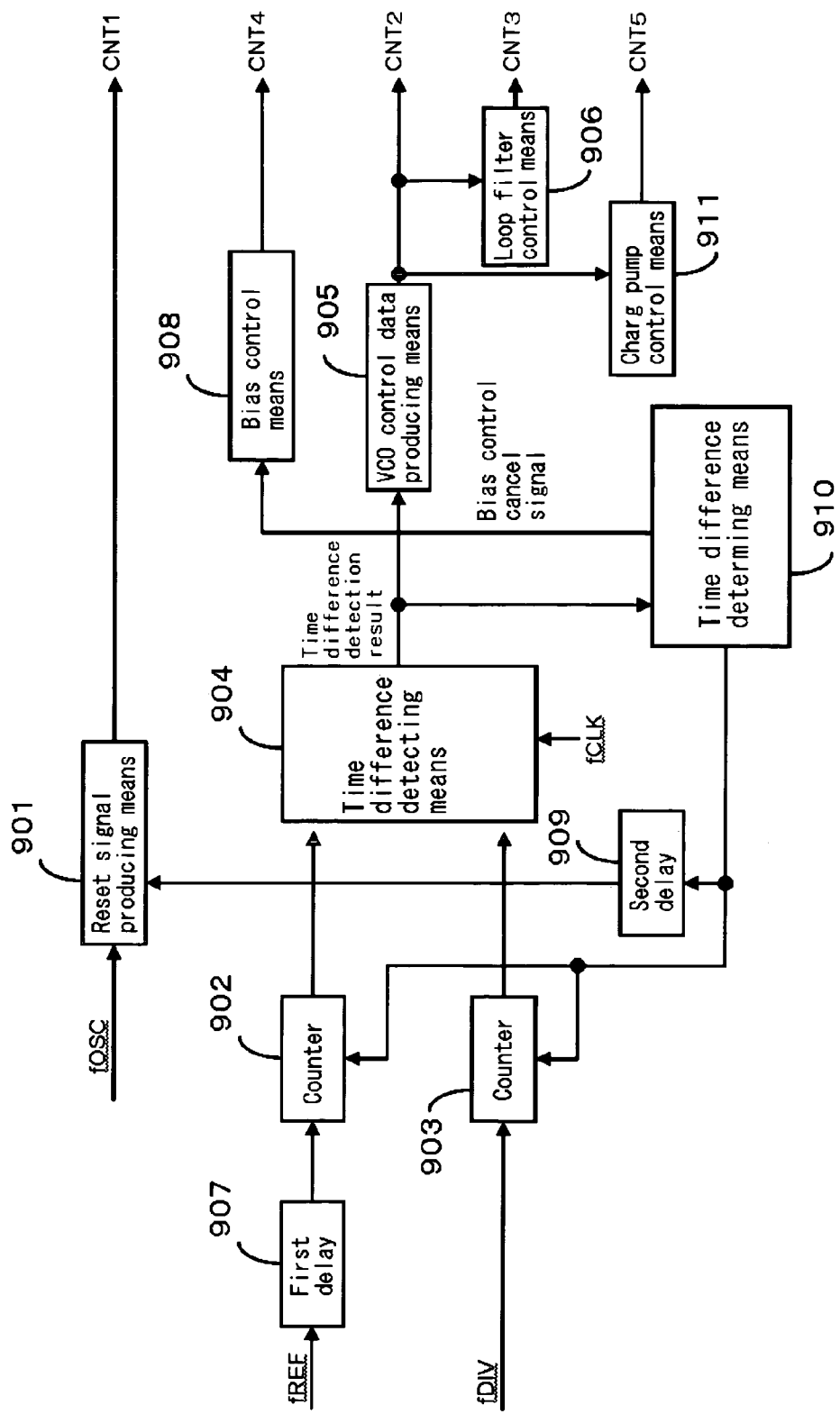
FIG. 3 is a block diagram of frequency adjusting means in the embodiment of the present invention.

FIG. 3 is a block diagram showing the constitution of the frequency adjusting means 9. The output signal FREF of the standard divider 5 is inputted into a counter 902 via a first delay means 907. The output signal fDIV of the counter 3 is inputted into a counter 903. Output signals are produced when the counter 902 and the counter 903 complete count of the same number, and those output signals are inputted into a time difference detecting means 904.

Further, the output signal fosc of the standard signal source 4 is inputted into a reset signal producing means 901.

Then the reset signal producing means 901 outputs the signal CNT1. The output signal fck of the pre-scaler 2 is inputted as a clock for time difference measurement into the time difference detecting means 904. The time difference detecting means 904 detects a difference in count completion time between the counter 902 and the counter 903, and then outputs the detection result to the time difference determining means 910 and a VCO control data producing means 905. The time difference determining means 910 inputs signals into the reset terminals of the counter 902 and the counter 903, and also outputs a signal to the reset signal producing means 901 via a second delay means 909. A bias control means 908 outputs the signal CNT4 in accordance with the output signal of the time difference determining means 910. The signal CNT2 outputted from the VCO control data producing means 905 is inputted into the loop filter control means 906 and a charge pump control means 911. The loop filter control means 906 outputs the signal CNT3, while the charge pump control means 911 outputs the signal CNT5. SW001, SW010 and SW100 produced with a set of three signals on the above-mentioned voltage controlled oscillator are connected to CNT2 as bus lines.

In the following, the operation of the VCO of FIG. 1 is described.

Capacity values of variable capacities VC1 and VC2 upon application of voltages V1 and V2 to a control voltage VT are referred to as CV1 and CV2. When VT=V1, and SW001, SW002 and SW003 are all off (Characteristic 1 of FIG. 4), an oscillation frequency of the VCO is expressed by equation 2.

In equations 2 and 3, in order to make the output frequencies equal to one another, C3 may be set to the value as shown in equation 4 below, based upon: $C1 \cdot CV1/(C1+CV1) = C3+C1 \cdot CV2/(C1+CV2)$.

$$C3 = C12(CV1-CV2)/(C1+CV1)(C1+CV2) \quad (4)$$

(a parasitic capacity is omitted)

Figure 4:
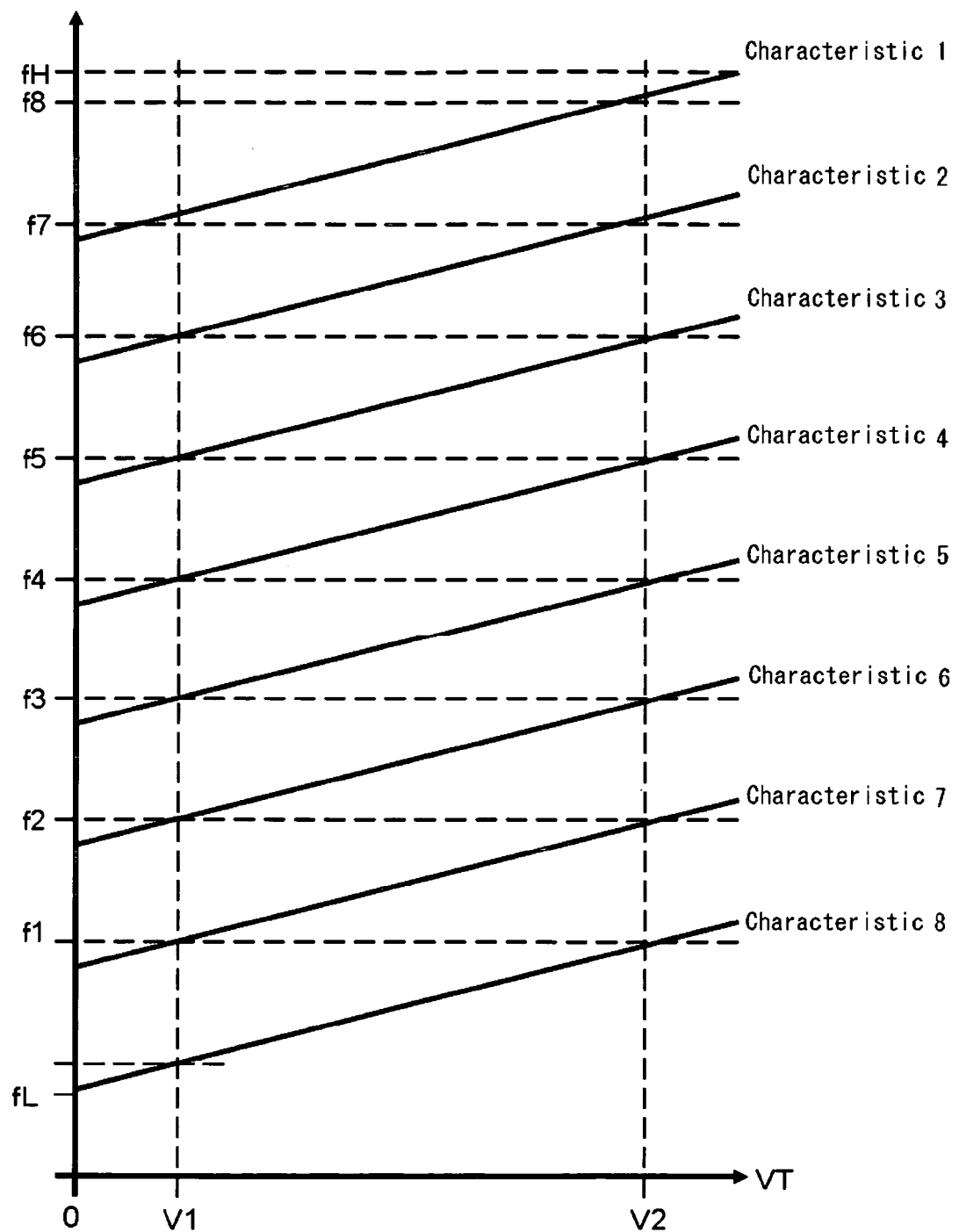
FIG. 4 is a characteristic graph of the oscillation frequency versus the phase noise in the voltage controlled oscillator of the present invention.

When the capacity C3 is set as shown in equation 5 below in the same setting manner as described above, frequency characteristics such as Characteristics 1 to 8 shown in FIG. 4 are obtained.

$$C3=C5-C3=C7-C3\times 3=C12(CV1-CV2)/(C1+CV1)(C1+CV2) \quad (5)$$

(a parasitic capacity is omitted)

Figure 5:
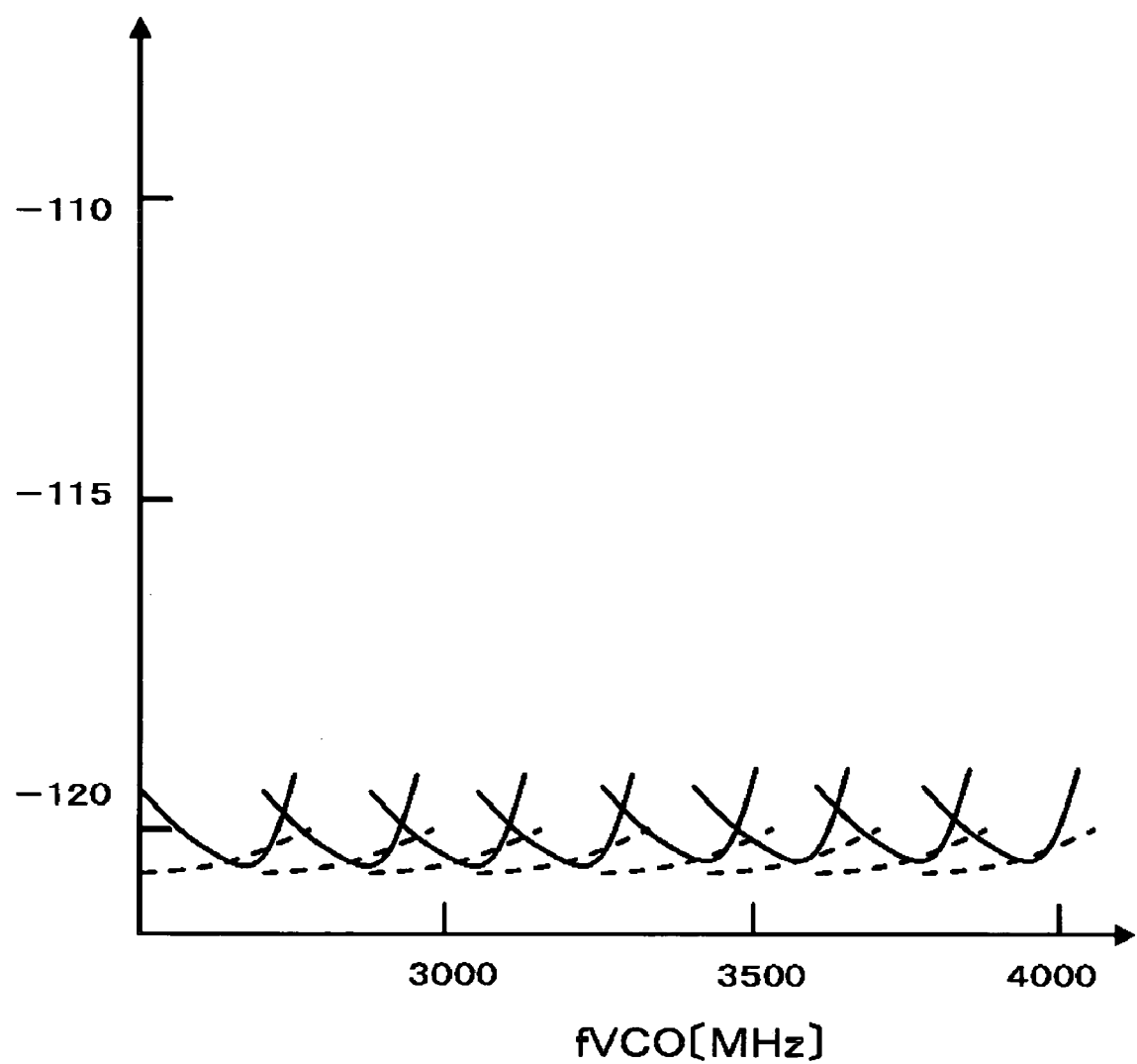
FIG. 5 is a characteristic graph of the control voltage versus the oscillation frequency in the voltage controlled oscillator of the present invention.
Figure 7:
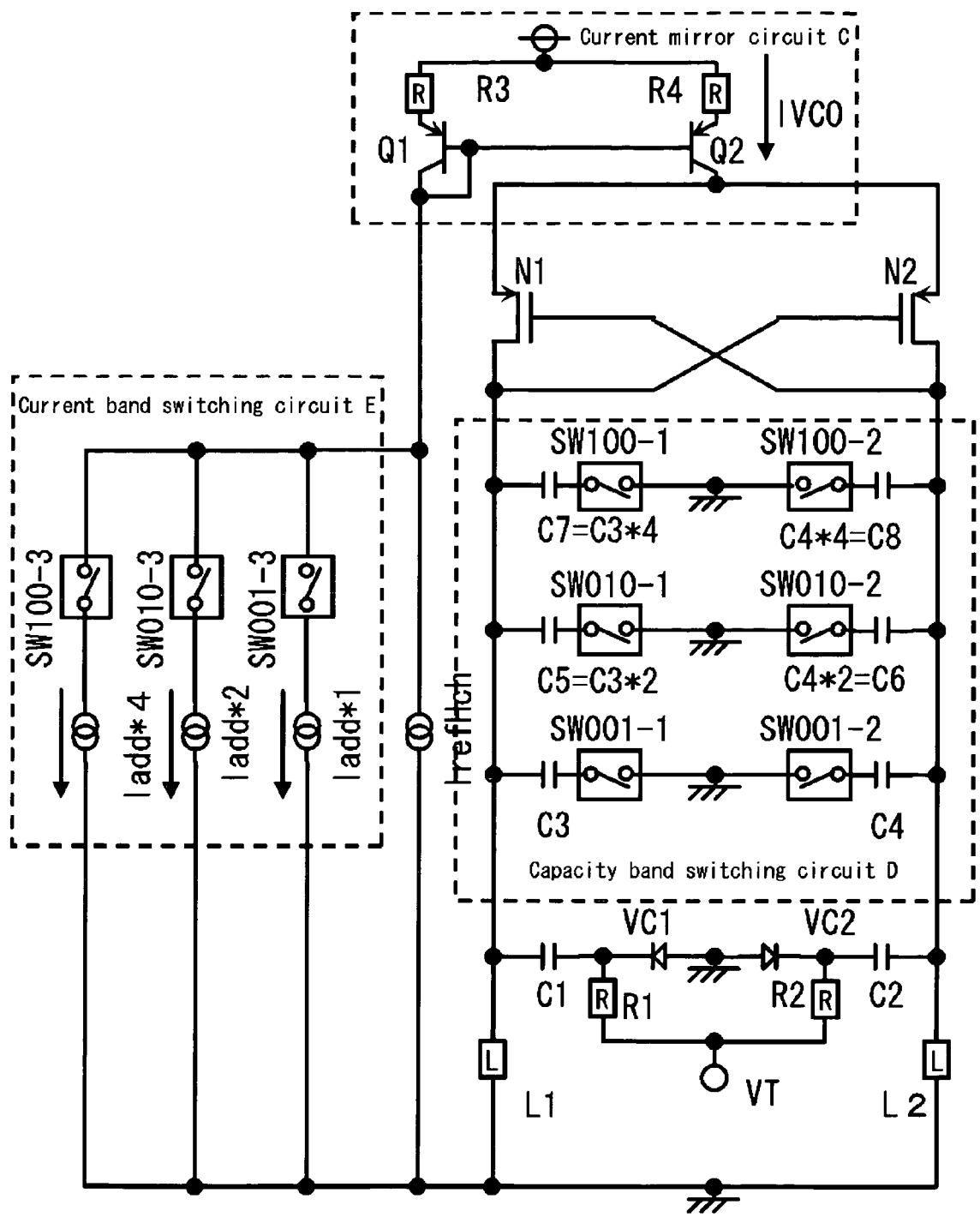
FIG. 7 is a block diagram of another voltage controlled oscillator in the embodiment of the present invention.

Therefore, by control of VT and CNT1 to CNT4, the oscillation frequency changes from fL when VT=0 as in FIG. 7 to fH when VT=VH, and the current band of FIG. 1 is switched in accordance with each of the frequency band characteristics. Thereby, the phase noise characteristic of the voltage controlled oscillator of the present invention becomes as in FIG. 5. As for sequences for controlling such a VCO, the current band switching control differs between the time when the frequency characteristics of the oscillation transistors N1 and N2 of FIG. 1 are sufficiently high (shown by a solid line) and when those are low (shown by a broken line), and the control sequences in the former and the latter cases are respectively shown in Tables 1 and 2. As the signals CNT 2 with respect to the VCO are SG001, SG010, SG100 and SG002, SG020 and SG200.

TABLE 1

| Setting condition | SG001 | SG010 | SG100 | SW001-1 | SW010-1 | SW0100-1 | SW001-2 | SW010-2 | SW100-2 | SW001-3 | SW010-3 | SW100-3 |
|---|---|---|---|---|---|---|---|---|---|---|---|---|
| Characteristic 1 | "L" | "L" | "L" | OFF | OFF | OFF | OFF | OFF | OFF | OFF | OFF | OFF |
| Characteristic 2 | "H" | "L" | "L" | ON | OFF | OFF | ON | OFF | OFF | ON | OFF | OFF |
| Characteristic 3 | "L" | "H" | "L" | OFF | ON | OFF | OFF | ON | OFF | OFF | ON | OFF |
| Characteristic 4 | "H" | "H" | "L" | ON | ON | OFF | ON | ON | OFF | ON | ON | OFF |
| Characteristic 5 | "L" | "L" | "H" | OFF | OFF | ON | OFF | OFF | ON | OFF | OFF | ON |
| Characteristic 6 | "H" | "L" | "H" | ON | OFF | ON | ON | OFF | ON | ON | OFF | ON |
| Characteristic 7 | "L" | "H" | "H" | OFF | ON | ON | OFF | ON | ON | OFF | ON | ON |
| Characteristic 8 | "H" | "H" | "H" | ON | ON | ON | ON | ON | ON | ON | ON | ON |

TABLE 2

| Setting condition | SG002 | SG020 | SG200 | SW001-1 | SW010-1 | SW0100-1 | SW001-2 | SW010-2 | SW100-2 | SW001-3 | SW010-3 | SW100-3 |
|---|---|---|---|---|---|---|---|---|---|---|---|---|
| Characteristic 1 | "L" | "L" | "L" | OFF | OFF | OFF | OFF | OFF | OFF | ON | ON | ON |
| Characteristic 2 | "H" | "L" | "L" | ON | OFF | OFF | ON | OFF | OFF | OFF | ON | ON |
| Characteristic 3 | "L" | "H" | "L" | OFF | ON | OFF | OFF | ON | OFF | ON | OFF | ON |
| Characteristic 4 | "H" | "H" | "L" | ON | ON | OFF | ON | ON | OFF | OFF | OFF | ON |
| Characteristic 5 | "L" | "L" | "H" | OFF | OFF | ON | OFF | OFF | ON | ON | ON | OFF |
| Characteristic 6 | "H" | "L" | "H" | ON | OFF | ON | ON | OFF | ON | OFF | ON | OFF |
| Characteristic 7 | "L" | "H" | "H" | OFF | ON | ON | OFF | ON | ON | ON | OFF | OFF |
| Characteristic 8 | "H" | "H" | "H" | ON | ON | ON | ON | ON | ON | OFF | OFF | OFF |

$$fVCO = 1/2\pi\sqrt{L \cdot \{C1 \cdot CV1/(C1+CV1)\}} \quad (2)$$

(a parasitic capacity is omitted)

When VT=V2, and SW001 is on (Characteristic 2 of FIG. 4), the oscillation frequency is expressed by equation 3.

$$fVCO = 1/2\pi\sqrt{L \cdot \{C3+C1 \cdot CV2/(C1+CV2)\}} \quad (3)$$

(a parasitic capacity is omitted)

In the control sequences at the time when the frequency characteristic is sufficiently high (Table 1), if the signal SG001=L, SW001-1=SW001-2=SW001-3=OFF;

if the signal SG010=L, SW010-1=SW010-2=SW010-3=OFF;

if the signal SG100=L, SW100-1=SW100-2=SW100-3=OFF;

if the signal SG001=H, SW001-1=SW001-2=SW001-3=ON;
if the signal SG010=H, SW010-1=SW010-2=SW010-3=ON; and
if the signal SG100=H, SW100-1=SW100-2=SW100-3=ON.

Namely, in the control sequences of Table 1, when a signal with respect to a certain switch group, eg. the signal (SG002) with respect to SW001-1, SW001-2 and SW001-3 is "L", the switches included in the group are all "OFF", and when the signal (SG001) is "H", the switches included in the group are all "ON".

In the control sequences at the time when the frequency characteristic is low (Table 2),
if the signal SG002=L, SW001-1=SW001-2=OFF, and SW001-3=ON;
if the signal SG020=L, SW0101-1=SW010-2=OFF, and SW010-3=ON;
if the signal SG200=L, SW100-1=SW100-2=OFF, and SW100-3=ON;
if the signal SG002=H, SW001-1=SW001-2=ON, and SW001-3=OFF;
if the signal SG020=H, SW010-1=SW010-2=ON, and SW010-3=OFF; and
if the signal SG200=H, SW100-1=SW100-2=ON, and SW100-3=OFF.

Namely, in the control sequences of Table 2, when a signal with respect to a certain switch group, eg. the signal (SG002) with respect to SW001-1, SW001-2 and SW001-3 is "t", SW001-1 and SW001-2 in the capacity band switching circuit D are "OFF" whereas SW001-3 in the current band switching circuit E is "ON", and when the signal (SG002) is "H", SW001-1 and SW001-2 are "ON" whereas SW001-3 is "OFF".

Next, the operations of the circuits of FIGS. 2 and 3 are described. When the counter value of the counter 3 to be set from the outside of the frequency synthesizer is changed, the reset signal producing means 901 is synchronized with fOSC or produces a reset pulse CNT1, to reset the standard signal source 4, the pre-scaler 2 and the counter 3. Simultaneously, the charge pump 7 is put into an output high impedance state by the bias control means 908, while a voltage V1 is applied via the output switch 10 of the charge pump 7. At this time, the bias control means 908 turns SW100 on, and the VCO oscillates at the frequency f4.

The same prescribed number of the output signal FREF of the standard divider 5 and the output signal fDIV of the counter 3 are counted with the counter 902 and the counter 903, respectively. When completing the prescribed count, the counters 902 and 903 output count completion signals. At this time, with the frequencies of FREF and fDIV different, a difference occurs in count completion time between the counters 902 and 903. The time difference detecting means 904 counts the number of pulses of the output signal FCLK produced in the pre-scaler 2 during the above-mentioned time difference. From this count result, the frequency of VCO1 at that time can be analogized. Hence the VCO control data producing means 905 outputs the analogized frequency as CNT2, as a control data for allowing the VCO to oscillate at the target oscillation frequency. If the count value of FCLK has exceeded the prescribed value, the time difference determining means 910 resets the counters 902 and 903, and also transmits a signal to the reset signal producing means 901 via the delay means 909. Upon receiving the signal from the delay means 909, the reset signal means 901 outputs fOSC as CNT1, and as a result resets the standard divider 5, the pre-scaler 2 and the counter 2, to restart the frequency adjustment operation.

The same operation is repeated, and when a count value of next FCLK is within a prescribed range, the time difference determining means 910 cancels the output high impedance state of the charge pump 7 via the bias control means 908 and application of the voltage V1 via the output switch 10 of the charge pump 7. At this time, in accordance with the output of the VCO control data producing means 905, a time constant of the loop filter 8 is switched by the loop filter control means 906. Further, in accordance with the output of the VCO control data producing means 905, the current capacity of the charge pump 7 is switched by the charge pump control means 911. Thereafter, the PLL operation returns to normal, to reach a phase lock.

It should be noted that, although the eight-band switching using the three switches was employed in switching the resonance band of the VCO in the above description, this switching number can be realized in a similar manner by any setting. Especially when the switching number is large, the VCO sensitivity per band can be lowered, to allow improvement in phase noise characteristic.

As thus described, according to the frequency synthesizer of the present embodiment, it is possible to attempt to expand a frequency variable range of a VCO as well as to obtain a favorable phase noise characteristic within the variable range so as to allow only one VCO to constitute VCOs of a plurality of communication systems such as GSM and DCS, thereby enabling an attempt to reduce cost.

Further, since the resonance frequency band of the VCO is switched by comparison of respective frequencies of fDIV and FREF, even if a pulse swallow divider is one that momentaneously changes a phase, such as a divider having been in use for a generally known fractional N-mode frequency synthesizer, phase-lock at a desired frequency is possible. Moreover, since PLL is made closed-loop after confirming that the oscillation frequency of VCO has got close to a desired oscillation frequency, phase-lock at a desired frequency is possible using an optical VCO control data.

Further, the delay means 909 is inserted for the purpose of eliminating the frequency variation time of the VCO immediately after the VCO control data has been changed. This allows accurate frequency adjustment.

Moreover, although the time difference determining means 904 was constituted so as to count fCLK, the detection can also be realized using a signal obtained by multiplying the output signal of the standard signal source 4. In this case, since the frequency of the signal to be counted is constant regardless of the frequency of the VCO, it is possible to secure stable accuracy of time difference detection at any given time. Further, even when the control sensitivity of the VCO changes, the frequency response characteristic of PLL is corrected by a time constant of the loop filter 8, and a current to be supplied to the VCO is corrected to an optical value in accordance with the VCO control data. It is thereby possible to obtain a stable phase noise regardless of the control data of the VCO. Since the correction by the current capacity of the charge pump 7 can for example be performed by changing the number of parallel transistors of the charge pump 7, or the like, a more detailed correction than the correction by the loop filter 8 is possible.

Furthermore, when there is a difference in frequency division starting time between the standard divider 5 and the variable divider of the pulse swallow constituted by the pre-scaler 2 and the counter 3, there also occurs a difference in count completion time between the counters 902 and 903 for counting fDIV and FREF as the respective outputs of the above-mentioned two dividers. Therefore, the reset signal CNT1 is synthesized with fOSC to match the frequency division starting time. This enables matching of the frequency division starting time of the standard divider 5 to the reset cancel time thereof so as to improve detection accuracy of the time difference detecting means 904. Further, in a narrow sense, the time at which the reset signal CNT1 is inputted into the standard divider 5 may not match the time when it is inputted into the pre-scaler 2. In the case where CNT1 reaches the pre-scaler 2 later than it reaches the standard divider 5, the signal FREF to be inputted into the counter 902 is delayed by the difference in transmission delay time. This allows correction of the transmission delay difference of the reset signal CNT1, and further allows improvement in accuracy of the time difference detecting means 904.

In the case of providing the frequency synthesizer of the present embodiment to an ambulant radio, it is possible to realize a small-sized ambulant radio of good communication quality at low cost. Further, in the case of providing the frequency synthesizer of the present embodiment to a radio base station device, it is possible to realize a small-sized radio base station device of good communication quality at low cost.

Figure 6:
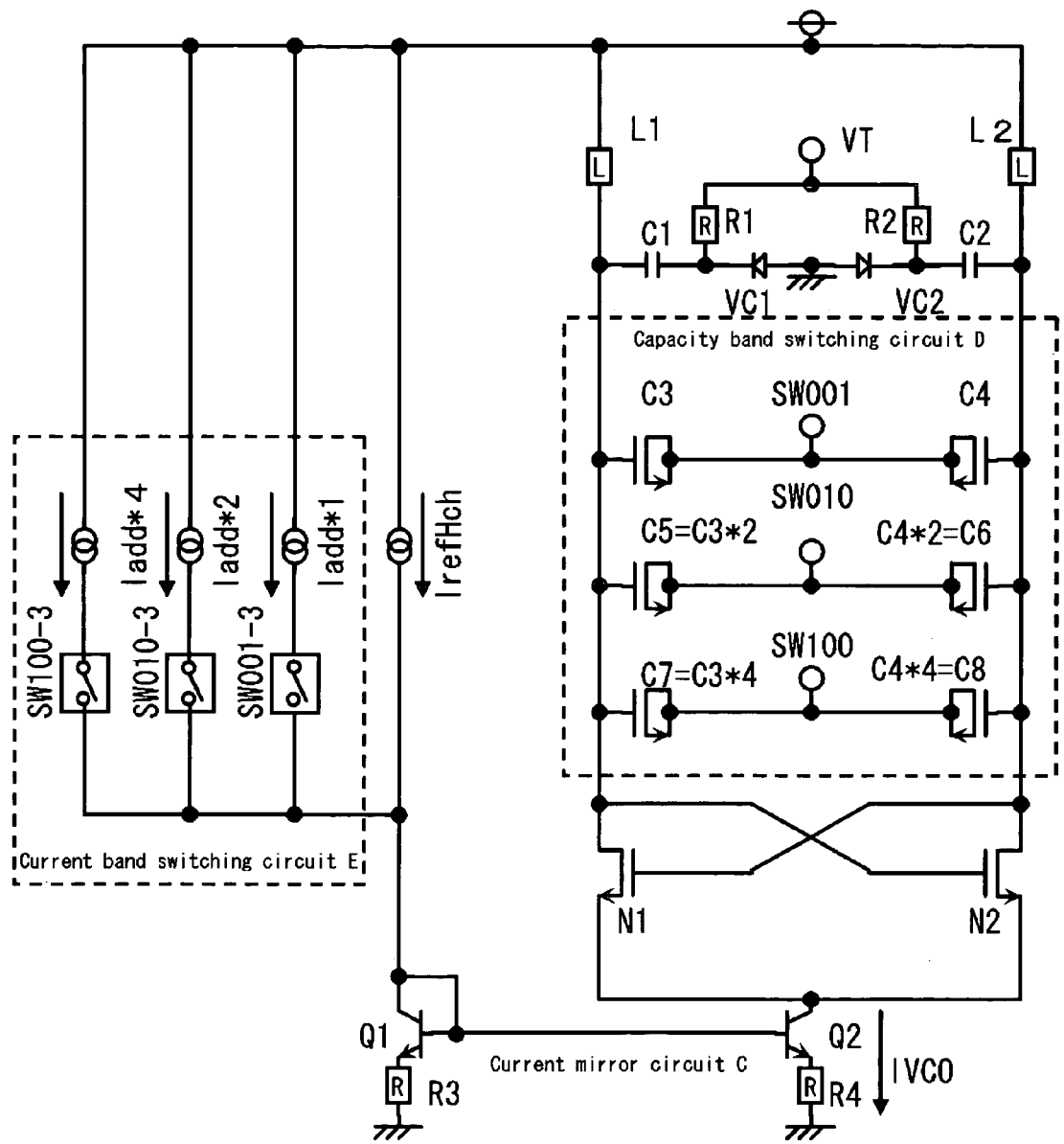
FIG. 6 is a block diagram of another voltage controlled oscillator in the embodiment of the present invention.

The capacity band switching circuit D may be constituted using a MOS type variable capacity with a switch function in place of the combinations of the capacities and the switches as shown in FIG. 6.

Further, an Nch-MOS transistor may be used as the current mirror circuit C in place of the NPN transistor. The current mirror circuit C provided on the ground side as shown in FIG. 1 may instead be provided on the power source side as shown in FIG. 7. Further, an Pch-MOSTransistor may be as the current mirror circuit C in place of PNP Transistor. In such a case, the NPN type is used for the transistors Q1 and Q2. Moreover, a circuit added with a compensation circuit may be used at the time of constituting the current mirror circuit, for further enhancing the constant current accuracy.

Figure 8:
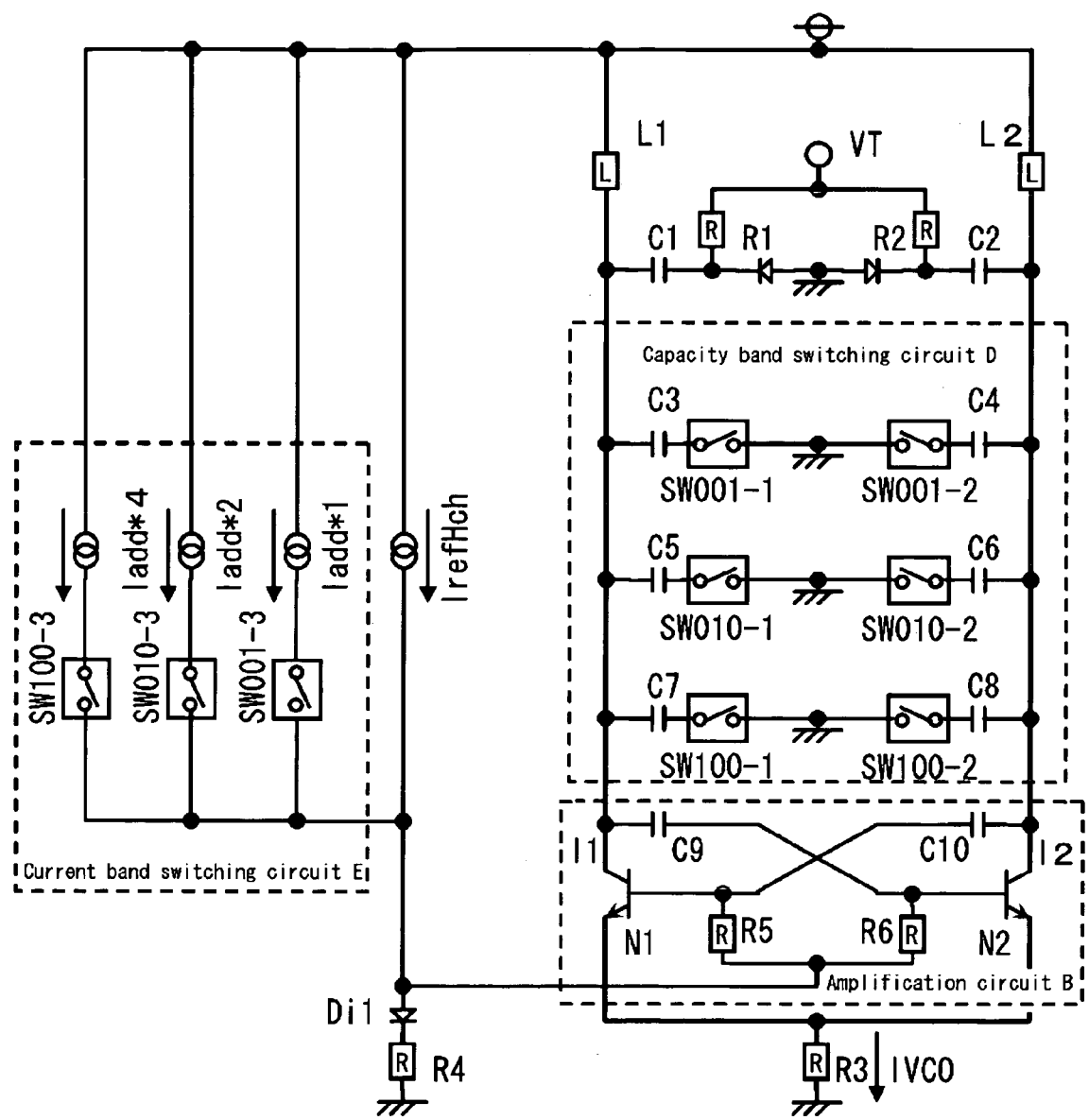
FIG. 8 is a block diagram of another voltage controlled oscillator in the embodiment of the present invention.

In the VCO of FIG. 8, the NPN type is used for the transistors N1 and N2 in an amplification circuit B, and as the bases thereof, capacities C9 and C10 are inserted for blocking direct current bias. The supply current by the current source IrefHch or the like is detected with a resistance R4 as a voltage value, and the voltage signal is given as bias to the bases of the transistors N1 and N2 via resistances R5 and R6, respectively. According to this circuit constitution, a current in accordance with the supply current is fed to the transistors N1 and N2, thereby enabling omission of the current mirror circuit.

Provision of a frequency synthesizer employing the voltage controlled oscillator of the present invention to an ambulant radio or a radio base station device allows production of a small-sized ambulant radio or a radio base station device of good speech quality at low cost.

The present disclosure relates to subject matter contained in Japanese Application No. 2004-268700, filed on Sep. 15, 2004, the contents of which are herein expressly incorporated by reference in its entirety.

What is claimed is:

1. A voltage controlled oscillator, comprising:
a resonance tank circuit comprising an inductor and a variable capacity diode; and an amplificationn circuit that performs oscillating and amplification at a resonance frequency of the resonance tank circuit, and changes a control voltage to the variable capacity diode to change an oscillation frequency,
wherein the resonance tank circuit is provided with a capacity band switching circuit to selectively add a capacity to change an oscillation frequency band, and a current band switching circuit to feed an appropriate driving current to the amplification circuit, with respect to the oscillation frequency band selected by the capacity band switching circuit;
wherein the capacity added by the capacity band switch circuit is determined such that an upper bound frequency in a certain oscillation frequency band connects with a lower bound frequency in a following oscillation frequency band by a frequency axis, and
wherein the capacity band switch circuit has at least two capacities and a switch inserted in series with the capacity and each capacity value of the at least two capacities increases one by one by a multiple of two.

2. A voltage controlled oscillator, comprising:
a resonance tank circuit comprising an inductor and a variable capacity diode; and an amplification circuit that performs oscillating and amplification at a resonance frequency of the resonance tank circuit, and changes a control voltage to the variable capacity diode to change an oscillation frequency,
wherein the resonance tank circuit is provided with a capacity band switching circuit that selectively adds a capacity to change an oscillation frequency band, and a current band switching circuit that feeds an appropriate driving current to the amplification circuit, with respect to the oscillation frequency band selected by the capacity band switching circuit, and
wherein the capacity band switch circuit has at least two capacities and a switch inserted in series with the capacity and each capacity value of the at least two capacities increases one by one by a multiple of two.

3. A voltage controlled oscillator, comprising:
a resonance tank circuit comprising:
an inductor; and
a variable capacity diode; and
an amplification circuit that performs oscillating and amplification at a resonance frequency of the resonance tank circuit, and changes a control voltage to the variable capacity diode to change an oscillation frequency, wherein the resonance tank circuit is provided with a capacity band switching circuit to selectively add a capacity to change an oscillation frequency band, a current band switching circuit to feed an appropriate driving current to the amplification circuit with respect to the oscillation frequency band selected by the capacity band switching circuit, and a current mirror circuit that supplies an output current of the current band switching circuit to the amplification circuit.

* * * * *